United States Patent
Hopkins et al.

(10) Patent No.: US 8,130,821 B2
(45) Date of Patent: Mar. 6, 2012

(54) EQUALIZATION IN CAPACITIVELY COUPLED COMMUNICATION LINKS

(75) Inventors: Robert D. Hopkins, Hayward, CA (US); Ronald Ho, Mountain View, CA (US); William S. Coates, Los Gatos, CA (US); Robert J. Drost, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1105 days.

(21) Appl. No.: 11/437,287

(22) Filed: May 18, 2006

(65) Prior Publication Data

US 2007/0268047 A1 Nov. 22, 2007

(51) Int. Cl.
*H04B 3/46* (2006.01)
(52) U.S. Cl. ......... 375/233; 375/232; 375/291; 375/288
(58) Field of Classification Search .............. 370/32.1; 379/411, 410, 399, 417; 375/291, 288
See application file for complete search history.

(56) References Cited

U.S. PATENT DOCUMENTS

| 5,012,245 | A  | * | 4/1991  | Scott et al.     | 341/150 |
|-----------|----|---|---------|------------------|---------|
| 5,194,837 | A  | * | 3/1993  | Smythe et al.    | 333/166 |
| 5,325,322 | A  | * | 6/1994  | Bailey et al.    | 708/819 |
| 5,604,423 | A  | * | 2/1997  | Degeneff et al.  | 323/258 |
| 5,995,817 | A  | * | 11/1999 | Lubbe et al.     | 455/266 |
| 6,018,282 | A  | * | 1/2000  | Tsuda            | 333/205 |
| 6,055,269 | A  | * | 4/2000  | Drost et al.     | 375/232 |
| 6,314,444 | B1 | * | 11/2001 | Minuhin et al.   | 708/819 |
| 7,508,882 | B2 | * | 3/2009  | Adamiecki et al. | 375/291 |
| 2003/0156603 | A1 | * | 8/2003 | Rakib et al.    | 370/485 |
| 2004/0223349 | A1 | * | 11/2004 | Nash            | 363/39  |
| 2005/0033792 | A1 | * | 2/2005 | Landolt         | 708/819 |
| 2006/0088090 | A1 | * | 4/2006 | Azenkot et al.  | 375/233 |
| 2008/0150599 | A1 | * | 6/2008 | Cranford et al. | 327/164 |

* cited by examiner

*Primary Examiner* — Ahmad Matar
*Assistant Examiner* — Kharye Pope
(74) *Attorney, Agent, or Firm* — Park, Vaughn, Fleming & Dowler LLP

(57) ABSTRACT

An integrated circuit containing a communication channel is described. This communication channel includes a transmit circuit configured to transmit signals using a voltage-mode driver, a receive circuit, and a capacitive link that couples the transmit circuit to the receive circuit. The communication channel includes a filter with a capacitive-summing junction to equalize signals communicated between the transmit circuit and the receive circuit.

19 Claims, 8 Drawing Sheets

── 700

```
┌─────────────────────────────────────┐
│  Communicate Signals From a Transmit │
│  Circuit Through a Capacitive Link to a │
│          Receive Circuit             │
│              710                     │
│                                      │
│   ┌───────────────────────────────┐  │
│   │  Equalize the Signals Using a │  │
│   │    Filter That Includes a     │  │
│   │  Capacitive-Summing Junction  │  │
│   │             712               │  │
│   └───────────────────────────────┘  │
└─────────────────────────────────────┘
```

FIG. 7 ved by the Defense Advanced Research Projects Administration. The United States Government has certain rights in the invention.

EQUALIZATION IN CAPACITIVELY COUPLED COMMUNICATION LINKS

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to techniques for communicating signals between electronic circuits. More specifically, the present invention relates to a method and an apparatus for equalizing signals that are communicated across capacitively coupled links.

2. Related Art

Communicating data over long on-chip signal lines or wires (also referred to as links) at high data rates consumes a significant portion of the total energy used by modern integrated circuit chips. Existing approaches to address this challenge include using capacitively coupled transmit drivers.

There are, however, limits to the performance improvement offered by such techniques. For example, even a capacitively coupled wire has a finite bandwidth due to intrinsic resistance, capacitance, and inductance. Such a lossy communication channel between circuits degrades system performance (resulting in an increased bit-error rate and/or increased power consumption) as a length of the on-chip wire and/or the data rate is increased. As a consequence, losses in wires limit the rate at which data may be communicated between circuits for a given wire length, communication channel error margin, and/or power budget.

What is needed is a method and an apparatus that facilitates communication on capacitively coupled links without the problems listed above.

SUMMARY

Embodiments of an electrical circuit containing a communication channel are described. This communication channel includes a transmit circuit configured to transmit signals using a voltage-mode driver, a receive circuit, and a capacitive link that couples the transmit circuit to the receive circuit. The communication channel includes a filter with a capacitive-summing junction to equalize signals communicated between the transmit circuit and the receive circuit.

In some embodiments, the filter is included in the transmit circuit and/or in the receive circuit.

The filter may include a finite impulse response (FIR) filter and/or an infinite impulse response (IIR) filter, wherein a frequency response for the link and the filter may be approximately uniform over a range of frequencies. In some embodiments, the filter may be configured to reduce cross-talk between at least two signal lines in the link.

The filter may include delay elements that have discrete time delays and/or continuous time delays. If discrete time delays are used, these delay elements may be configured to be clocked using a clock signal that has a frequency that is the same as or different from a chip rate of the circuit.

The filter may include weight elements that have fixed or adjustable weights. The weight elements may include elements that have a nonlinear relationship between capacitance and control voltage.

An output voltage from the filter may be a weighted-average of voltages from taps in the filter. A respective weight may correspond to a respective capacitance of a respective tap in the filter. A capacitance of the respective weight element may correspond to a number of capacitances that are selectively coupled to an input and an output of the respective weight element.

The capacitive-summing junction may include at least two signal lines that are proximate to one another.

In some embodiments, the circuit may further include control logic. This control logic may be configured to adjust a frequency response of the filter in accordance with a performance metric of the communication channel. The performance metric may include a difference between a sequence received by the receive circuit and a pre-determined sequence. The control logic may be configured to adjust the frequency response when the circuit is powered on, after at least a pre-determined time interval since a last modification or adjustment, and/or continuously.

In some embodiments, the electrical circuit may be included in an integrated circuit in a computer system. The computer system may include a processor and memory that is configured to store one or more program module mechanisms. The one or more program module mechanisms may be configured and/or configurable to be executed by the processor.

Another embodiment provides a method for communicating signals within an integrated circuit. During this method, signals are communicated from a transmit circuit through a capacitive link to a receive circuit using voltage-mode signaling. As the signals are communicated, the signals are equalized using a filter that includes a capacitive-summing junction.

BRIEF DESCRIPTION OF THE FIGURES

FIG. 7 is a flow chart illustrating an embodiment of a process for communicating signals.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method and a circuit that includes an equalizer and capacitively coupled link between a transmit circuit and a receive circuit are described. The transmit circuit, the receive circuit and the capacitively coupled link may form a communication channel, wherein the link may include one or more signal lines or wires. The circuit may be included on a printed circuit board and/or in an integrated circuit. The equalizer may include a filter that has a capacitive-summing junction. An output voltage from the filter may be a weighted-average of voltages from taps in the filter, wherein a respective weight may correspond to a respective capacitance of a respective tap in the filter.

A frequency response for the link and the filter may be approximately uniform over a range of frequencies. Cross-talk between at least two signal lines in the link may be reduced and/or eliminated by the filter. The filter may increase an effective bandwidth of the link and/or improve system performance (for example, a reduced bit-error rate, a reduced power consumption of the circuit, and/or a reduction in a number of signal lines or wires used to communicate the data). The circuit, therefore, may improve communication of data in applications such as on-chip communication over long wires.

Figure 1:
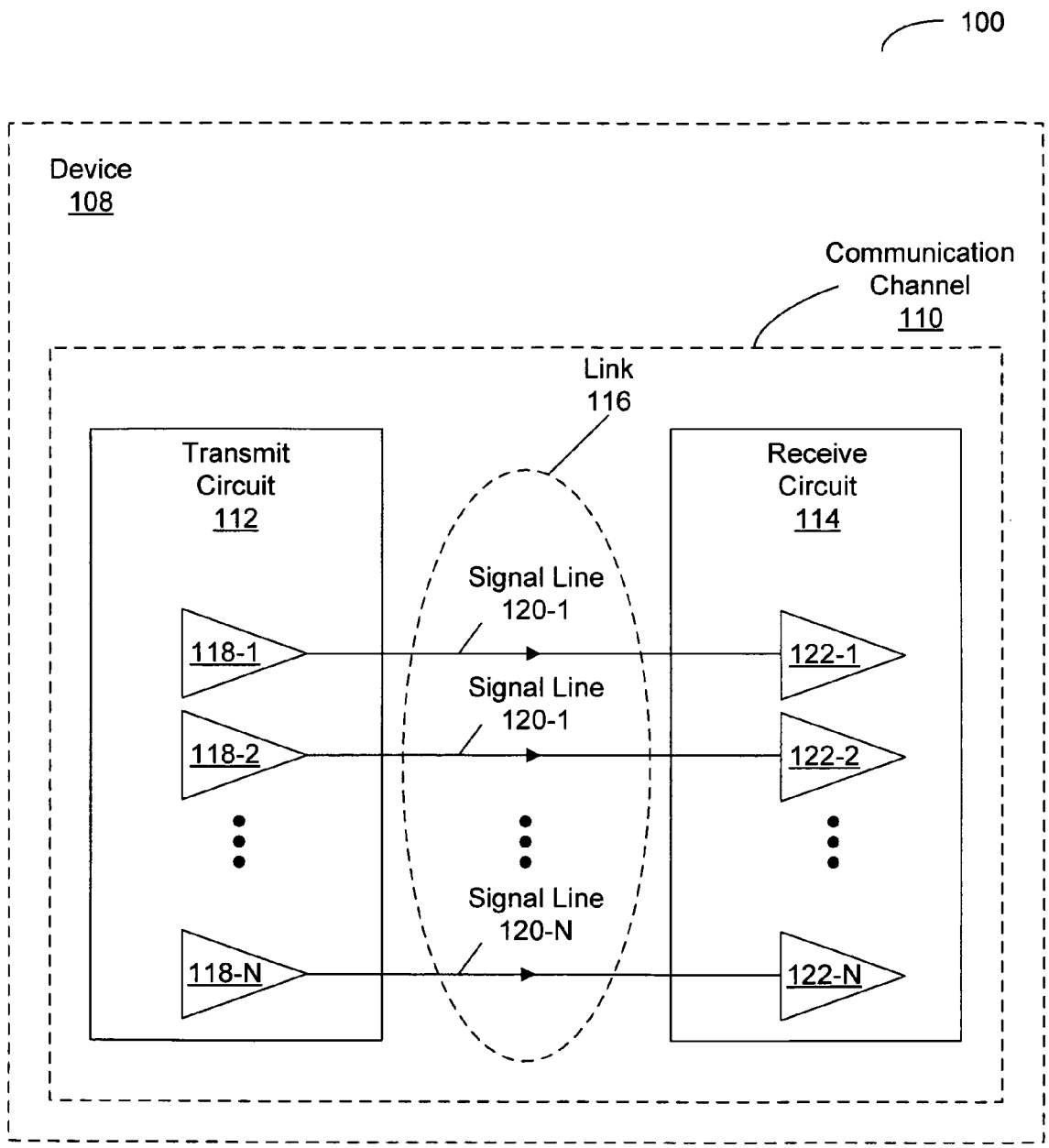
FIG. 1 is a block diagram illustrating an embodiment of a device that includes a communication channel.

Attention is now directed towards embodiments of a circuit for improved communication. FIG. 1 is a block diagram illustrating an embodiment 100 of a device 108 that includes a communication channel 110. This communication channel 110 may include a transmit circuit 112, a receive circuit 114, and a link 116, wherein the link 116 may capacitively couple the transmit circuit 112 to the receive circuit 114. The transmit circuit 112 may include one or more transmit drivers 118, which may use voltage-mode signaling and/or current-mode signaling. The link 116 may also include one or more signal lines 120, wherein at least a subset of the one or more signal lines 120 may comprise at least a portion of a communication bus. Moreover, the receive circuit 114 may include one or more receivers 122.

Communication channel 110 may be used to communicate data, in the form of signals on the link 116, between the transmit circuit 112 and the receive circuit 114. While the link 116 is illustrated as providing unidirectional communication of the data, in some embodiments data may be communicated in an opposite direction and/or bi-directionally. In some embodiments, link 116 may be used to communicate one or more bands of frequencies (such as a baseband and/or one or more passbands). In some embodiments, a communication direction over the link 116 and/or one or more bands of frequencies may be defined dynamically by control logic (not shown). For example, one or more bands of frequencies may be dynamically defined and/or allocated if the communication channel 110 utilizes techniques, such as discrete multi-tone communication.

In one embodiment, device 108 may include an integrated circuit (also referred to as a chip). In these embodiments, therefore, the communication channel 110 may be used for on-chip communication. In other embodiments, the device 108 may include two or more integrated circuits. Thus, in these embodiments the communication channel 110 may be used for inter-chip communication. In some embodiments, the device 108 may include a printed circuit board and two or more integrated circuits.

While the device 108 includes one communication channel 110, one transmit circuit 112, one link 116, and one receive circuit 114, in other embodiments the device 108 may include fewer components or additional components. Note that two or more components may be combined into a single component, and a position of one or more components may be changed.

As described previously, losses in the link 116 may limit the bandwidth and/or data rate between the transmit circuit 112 and the receive circuit 114. These losses may be reduced and/or eliminated using equalization, and thus the performance of the communication channel 110 may be improved. This is illustrated in FIG. 2, which is a block diagram of an embodiment of a communication channel 200 that includes equalization.

Figure 2:
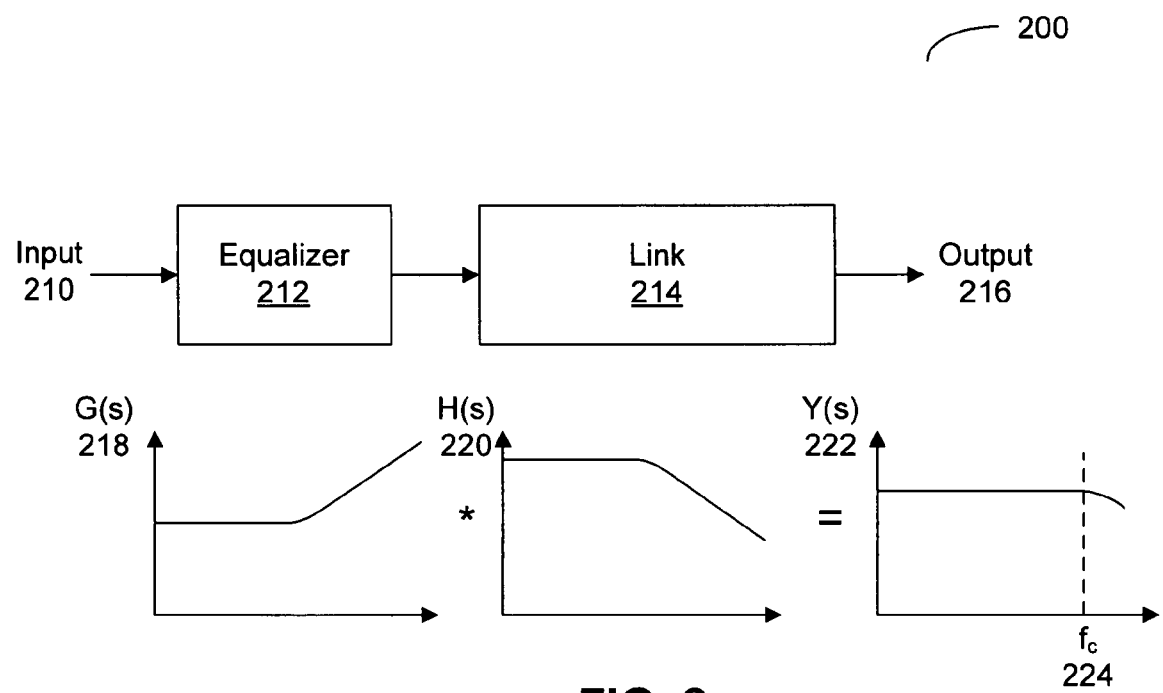
FIG. 2 is a block diagram illustrating an embodiment of a communication channel that includes equalization.

As illustrated in FIG. 2, input data or signals 210 having a frequency response X(s) may be input into an equalizer 212 having a frequency response G(s) 218. The equalizer 212 may be coupled to a link 214 having a frequency response H(s) 220, and output data or signals 216 having a frequency response Y(s) 222 may be output from the link 214.

Without compensation, the frequency response H(s) 220 of the link 214 may reduce the performance of the communication channel 200. For example, attenuation of some frequencies may give rise to inter-symbol interference. A typical wire or signal line may have a low-pass frequency response, in which frequencies below a cutoff frequency are passed unaltered and frequencies above the cutoff frequency are attenuated. If the input 210 includes a long sequence of logical high values (such as +1 s), the output 216 is eventually driven to an extremum value. In the frequency domain, this corresponds to a low frequency signal. If the input 210 then has one or more logical low values, there may not be sufficient time for the output 216 to be driven to a neutral level (such as GND) before being driven to a value corresponding to the logical low. As a consequence, even if the input 210 remains low for several bit periods, the output 216 corresponding to the logical low may be attenuated. In essence, the previous logical high interferes with the subsequent logical low and the high frequency content in the input 210 is attenuated.

The frequency response G(s) 218 of the equalizer 212 may be used to correct for such effects. In particular, the frequency response G(s) 218 may be selected, determined and/or adapted such that the product of the frequency response G(s) 218 and the frequency response H(s) 220 may result in the frequency response Y(s) 222 of the output data or signals 216 that improves the performance of the communication channel 200. For example, a magnitude and/or phase of the frequency response Y(s) 222 may be approximately uniform or constant over a range of frequencies, such as between DC (or approximately near DC) and a cut-off frequency $f_c$ 224. This may reduce and/or eliminate the afore-mentioned inter-symbol interference. The range of frequencies in Y(s) 222 that have an approximately uniform or constant magnitude may include the frequencies in X(s) that correspond to the input data or signals 210. In some embodiments, variation in the magnitude of the frequency response Y(s) 222 within the range of frequencies may be less than 3 dB of an average or a peak of the magnitude of the frequency response Y(s) 222 within the range of frequencies. The improved performance of the communication channel 200 may allow the data rate to be increased and/or a power consumption of a transmit driver to be reduced while maintaining the bit-error rate.

The communication channel 200 may include fewer components or additional components. For example, in some embodiments the equalizer 212 may be implemented as two or more filters. Moreover, two or more components in the communication channel 200 may be combined into a single component. Note that a position of one or more components may be changed. For example, in some embodiments the equalizer 212 may be implemented after the link 214 instead of before it.

As described above, equalization may be implemented in different portions of the communication channel, including the transmit circuit 112 (FIG. 1), the receive circuit 114 (FIG. 1), and/or the link 116 (FIG. 1). Several embodiments including equalization are illustrated in FIGS. 3A-3C.

Figure 3A:
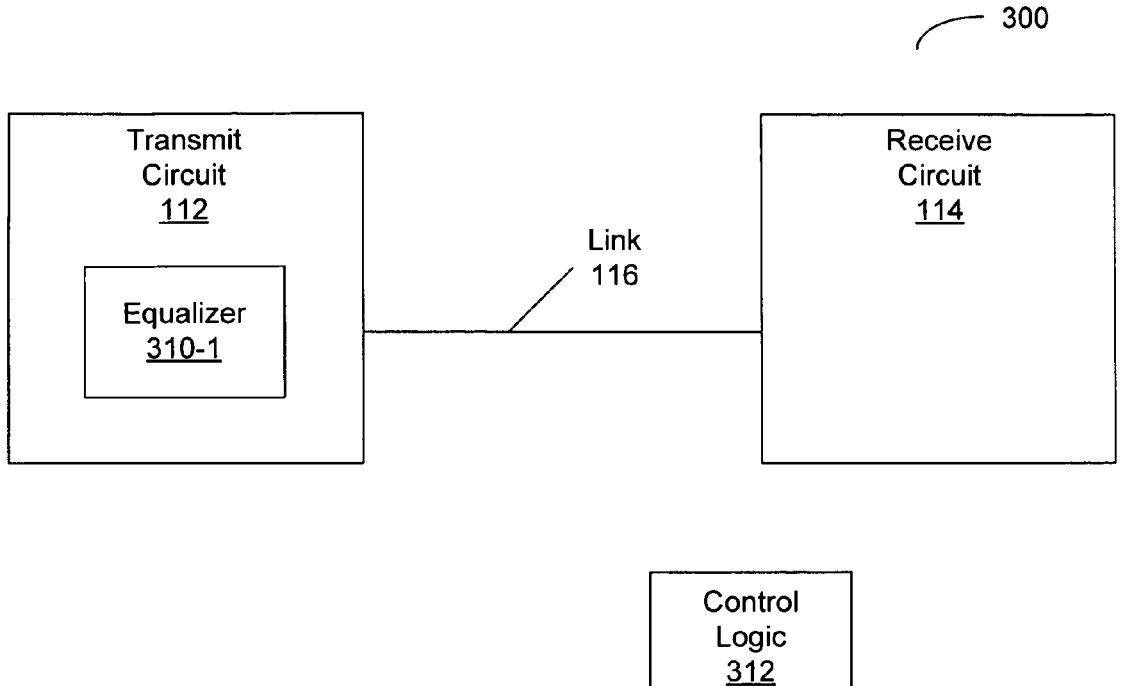
FIG. 3A is a block diagram illustrating an embodiment of a circuit that includes an equalizer.

FIG. 3A is a block diagram illustrating an embodiment of a circuit 300 that includes an equalizer 310-1 in the transmit circuit 112. This corresponds to pre-emphasis, where the equalizer 310-1 boosts a certain frequency content of signals (typically, the higher frequency content) to compensate for a frequency response of the link 116, such as roll-off or attenuation at high frequencies. Equalization in the transmit circuit 112 is described further below with reference to FIG. 5.

Figure 3B:
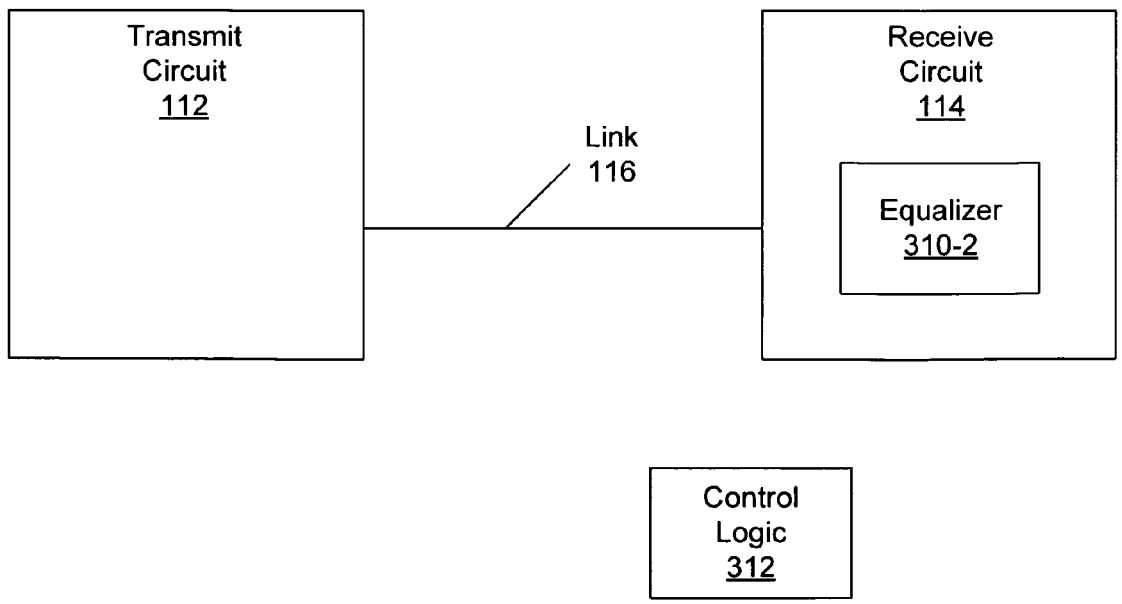
FIG. 3B is a block diagram illustrating an embodiment of a circuit that includes an equalizer.

FIG. 3B is a block diagram illustrating an embodiment of a circuit 330 that includes an equalizer 310-2 in the receive circuit 114. This approach to equalization may use less energy, since signals with reduced amplitude may be transmitted through the link 316. Equalization in the receive circuit 114 is described further below with reference to FIG. 6.

Figure 3C:
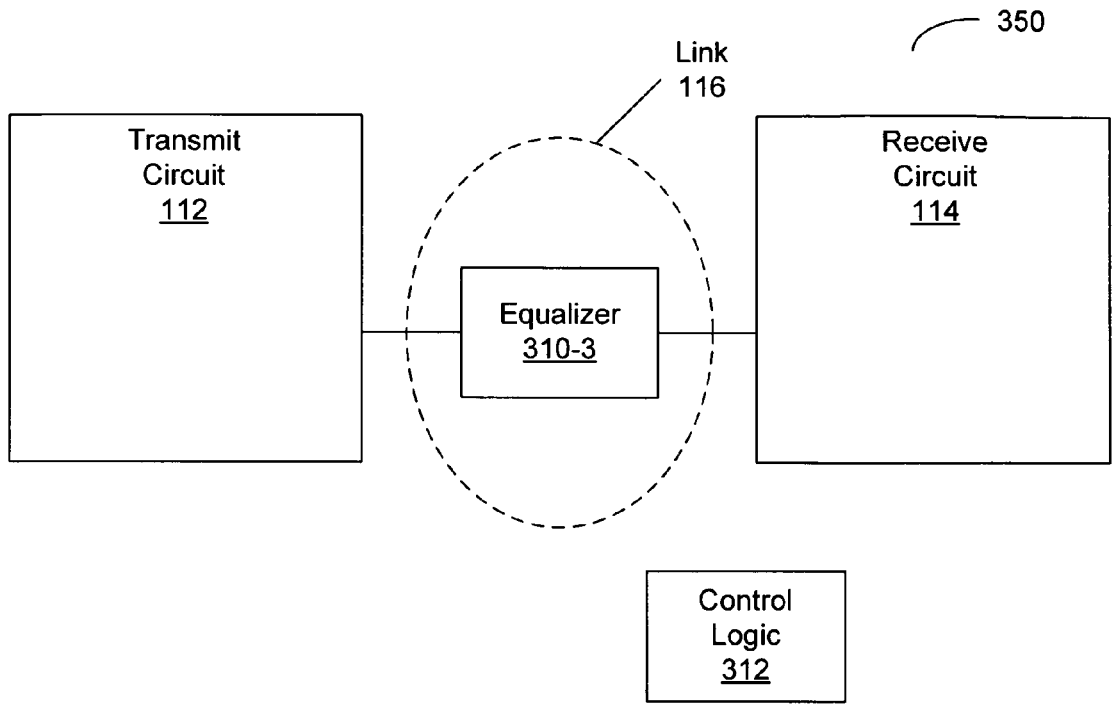
FIG. 3C is a block diagram illustrating an embodiment of a circuit that includes an equalizer.

FIG. 3C is a block diagram illustrating an embodiment of a circuit 350 that includes an equalizer 310-3 in the link 116. The equalizer 310-3 may be discrete or may be distributed over at least a portion of the link 116.

The circuits 300 (FIG. 3A), 330 (FIG. 3B), and/or 350 may include control logic 312. Control logic 312 may be configured to adjust a frequency response of the equalizers 310-1 (FIG. 3A), 310-2 (FIG. 3B), and/or 310-3 in accordance with a performance metric of the communication channel. The adjustment may use a least mean squares (relative to an equalization target response) and/or or a binary search technique. The adjustment may change a number of taps, one or more delays, and/or one or more weights (including one or more signs) in the equalizers 310-1 (FIG. 3A), 310-2 (FIG. 3B), and/or 310-3. The performance metric may include equality and/or difference between a data sequence received by the receive circuit 114 (for example, using a threshold detector) and a pre-determined sequence or test sequence that is transmitted by the transmit circuit 112. The pre-determined data sequence may include a pseudo-random sequence. In an exemplary embodiment, the pseudo-random sequence may have between $2^7-1$ and $2^{31}-1$ bits.

In some embodiments, the frequency response of the equalizers 310-1 (FIG. 3A), 310-2 (FIG. 3B), and/or 310-3 may be static. In some embodiments, the control logic 312 may be configured to determine, select and/or adjust the frequency response when the circuits 300 (FIG. 3A), 330 (FIG. 3B), and/or 350 are powered on. In some embodiments, the control logic 312 may be configured to determine, select and/or adjust the frequency response after at least a pre-determined time interval since a last adjustment or modification of the equalizers 310-1 (FIG. 3A), 310-2 (FIG. 3B), and/or 310-3. In an exemplary embodiment, the pre-determined time interval is approximately between 1 μs and 1 s. In some embodiments, the control logic 312 may be configured to determine, select and/or adjust the frequency response continuously. In some embodiments, the control logic 312 may be configured to determine, select and/or adjust the frequency response one-time, such as in a factory. In these embodiments, the control logic 312 may be external to the circuits 300 (FIG. 3A), 330 (FIG. 3B), and/or 350. Moreover, control logic 312 may be coupled to the circuits 300 (FIG. 3A), 330 (FIG. 3B), and/or 350 using probe pads when the circuits 300 (FIG. 3A), 330 (FIG. 3B), and/or 350 are at a die or wafer level.

Note that circuits 300 (FIG. 3A), 330 (FIG. 3B), and/or 350 may include fewer components or additional components. Moreover, two or more components may be combined into a single component, and/or a position of one or more components may be changed.

Figure 4:
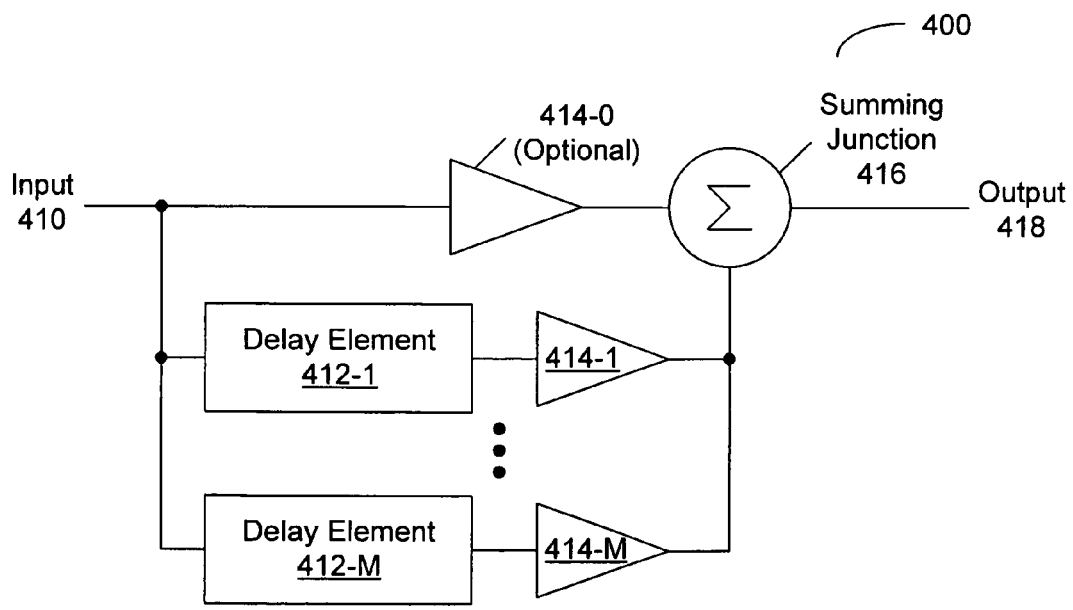
FIG. 4 is a block diagram illustrating an embodiment of a finite impulse response (FIR) filter.

The equalizers 310 (FIGS. 3A-3C) may include one or more filters, including a finite impulse response (FIR) filter and/or an infinite impulse response (IIR) filter. More specifically, FIG. 4 is a block diagram illustrating an embodiment of an FIR filter 400 having M parallel paths or taps. An input 410 is coupled to the M taps. With exception of tap zero, a respective tap includes a delay element 412 and a weight 414. In some embodiments, tap zero (i.e., the tap without a delay element 412) includes an optional weight 414-0. Signals from the M taps may be combined in a summing junction 416 to produce an output 418. The output 418, therefore, is a weighted summation of previous and current signals in the input 410. With sufficient taps, a filter, such as the filter 400, may approximate an arbitrary frequency response.

The filter 400 may include fewer components or additional components, two or more components may be combined into a single component, and/or a position of one or more components may be changed. For example, an order of the delay elements 412 and the weights 414 may be reversed in one or more of the taps.

Figure 5:
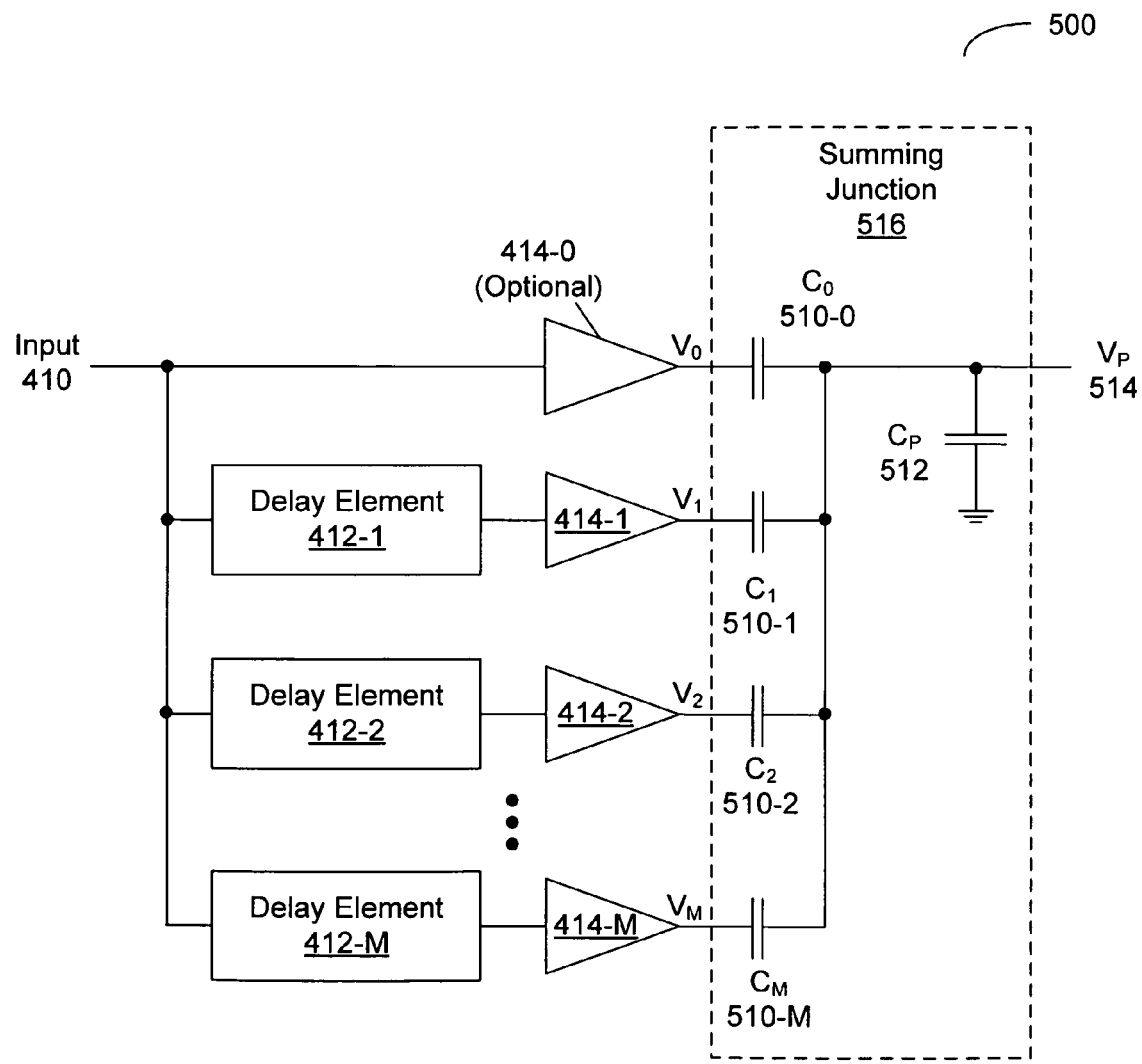
FIG. 5 is a block diagram illustrating an embodiment of a filter that includes a capacitive-summing junction.

As discussed further below with reference to FIGS. 5 and 6, a wide variety of components may be used to implement filters, such as the filter 400. The type of transmit driver and/or signaling technique used in the transmit drivers may, however, complicate the implementation of the summing junction 416. Many high-speed inter-chip communication channels use a technique known as current-mode signaling. In this approach, data that is to be communicated may be encoded using current levels. For example, a current of +50 mA may denote a logical high and a current of −50 mA may denote a logical low. Moreover, the summing junction 416 may sum currents, for example, by tying outputs from current sources in different taps directly to a common conductor.

For high-speed on-chip communication, however, voltage-mode signaling is often used. In this approach, data that is to be communicated may be encoded using two or more voltage levels. For example, a voltage of +1 V may denote a logical high and a voltage of 0 V may denote a logical low. Other embodiments may utilize additional voltage levels, such as in multiple-pulse amplitude modulation (multi-PAM). When the transmit drivers are voltage-mode drivers, i.e., when they utilize voltage-mode signaling, summing junction 416 may not be implemented by simply tying the outputs of multiple drivers in different taps to a common conductor. To address this challenge, active circuitry to appropriately sum the voltages from different taps may be used. This approach, however, may increase the complexity and power consumption of the circuits in the communication channel.

When the link 116 (FIG. 1) capacitively couples the transmit circuit 112 (FIG. 1) and the receive circuit 114 (FIG. 1), it may be possible to simply implement a capacitive-(voltage-)summing junction in a filter, such as the filter 400. This is illustrated in FIG. 5, which is a block diagram of an embodiment of a filter 500 that includes a capacitive-summing junction 516. The filter 500 may be included in the equalizer 310-1 (FIG. 3A) that is in the transmit circuit 112 (FIG. 3A).

Charge corresponding to voltages $V_i$ on one or more of the taps in the filter 500 may be coupled to the link 116 (FIG. 1)

via capacitances $C_i$ 510, and link 116 (FIG. 1) may have a capacitance to ground $C_p$ 512. Furthermore, an output voltage $V_p$ 514 from the filter 500 may be expressed as $$V_p = \frac{\sum_{i=1}^{M} C_i \cdot V_i}{C_p + \sum_{i=1}^{M} C_i},$$

where M is a number of taps coupled between an input and an output of the filter 500 or a number of taps having a non-zero weight element 414. The output voltage $V_p$ 514 is a weighted average of the voltages $V_i$, with the relative weights set by the capacitances $C_i$ relative to the total capacitance. Thus, when voltage-mode signaling is used in conjunction with capacitive coupling, the summing junction 416 (FIG. 4) may be implemented by tying the outputs of multiple drivers in different taps to a common conductor.

In some embodiments with on-chip wires, the capacitive-summing junction 516 may be implemented using on-chip wires or signal lines that are proximate to one another. In some embodiments, the capacitive-summing junction 516 may be implemented using alternate metal layers or with metal layers that are wrapped around a wire or signal line.

Note that delay elements 412 in the filter 500 may have discrete time delays (such as one or more cascaded flip flops and/or latches) and/or continuous time delays (such as delay lines and/or chains of one or more buffers). Moreover, delay elements 412 may be configured to be clocked using a clock signal that has a frequency that is different from a chip rate (i.e., a number of bits or symbols per second) of the circuit. In some embodiments, the delay elements 412 may be configured to be clocked using a clock signal that corresponds to the chip rate.

In some embodiments, filter 500 may include weight elements 414 that have fixed and/or adjustable weights. Furthermore, weight elements 414 may include elements that have a nonlinear relationship between capacitance and control voltage (such as veractors and/or transistors). For example, in an active device such as a metal oxide semiconductor (MOS) transistor, the capacitance may be modified by adjusting a bias level in the MOS capacitor and/or by changing the body voltage. In some embodiments, a capacitance of a respective weight element, such as the weight element 414-1, may correspond to a number of capacitances that are selectively coupled (for example, using a multiplexer) in parallel to an input and an output of the respective weight element. Such a digital capacitor may allow a wide range of capacitance values to be obtained.

In some embodiments, adjacent and/or neighboring chips communicate using proximity communication, in which the transmit circuit 112 in FIG. 1 and the receive circuit 114 in FIG. 1 are each coupled to metal pads or plates. In these embodiments, the number of capacitances may be adjusted by changing a number of pads that are used. In some embodiments, a weight of the respective weight element may be adjusted by changing a voltage swing and/or a slew rate. Two or more of the afore-mentioned approaches may be used in filters, such as the filter 500.

In some embodiments, a number of taps, one or more delays of one or more delay elements 412, and/or one or more weights (for example, one or more capacitances) of one or more weight elements 414 may be determined, selected and/or adjusted using the control logic 312 (FIGS. 3A-3C). For example, the filter 500 may initially include one tap (tap zero) that is coupled between the input and the output of the filter. Based on the performance metric, one or more additional taps may be added and the corresponding delays and/or weights may be modified in accordance with an algorithm in the control logic 312 (FIGS. 3A-3C). In some embodiments, the filter 500 may be adapted one-time, after a pre-determined time interval since a previous modification, or continuously. Such flexibility may allow the filter 500 to accommodate process variation in one or more characteristics of the circuit, and may improve operating margins, reduce power and/or improve system performance.

In an exemplary embodiment, link 116 (FIG. 1) includes a signal line that is 14 mm long and 0.5 μm wide. The bandwidth of such a link 116 (FIG. 1) may be 200 MHz. In this case, using a filter, such as the filter 500, that includes a second tap (in addition to tap zero) that has a delay element with a 1.5 ns delay and a weight element with a weight of 0.3 (relative to tap zero) may increase the bandwidth to 400 MHz. Note that filter 500 may include fewer components or additional components, two or more components may be combined into a single component, and/or a position of one or more components may be changed.

Figure 6:
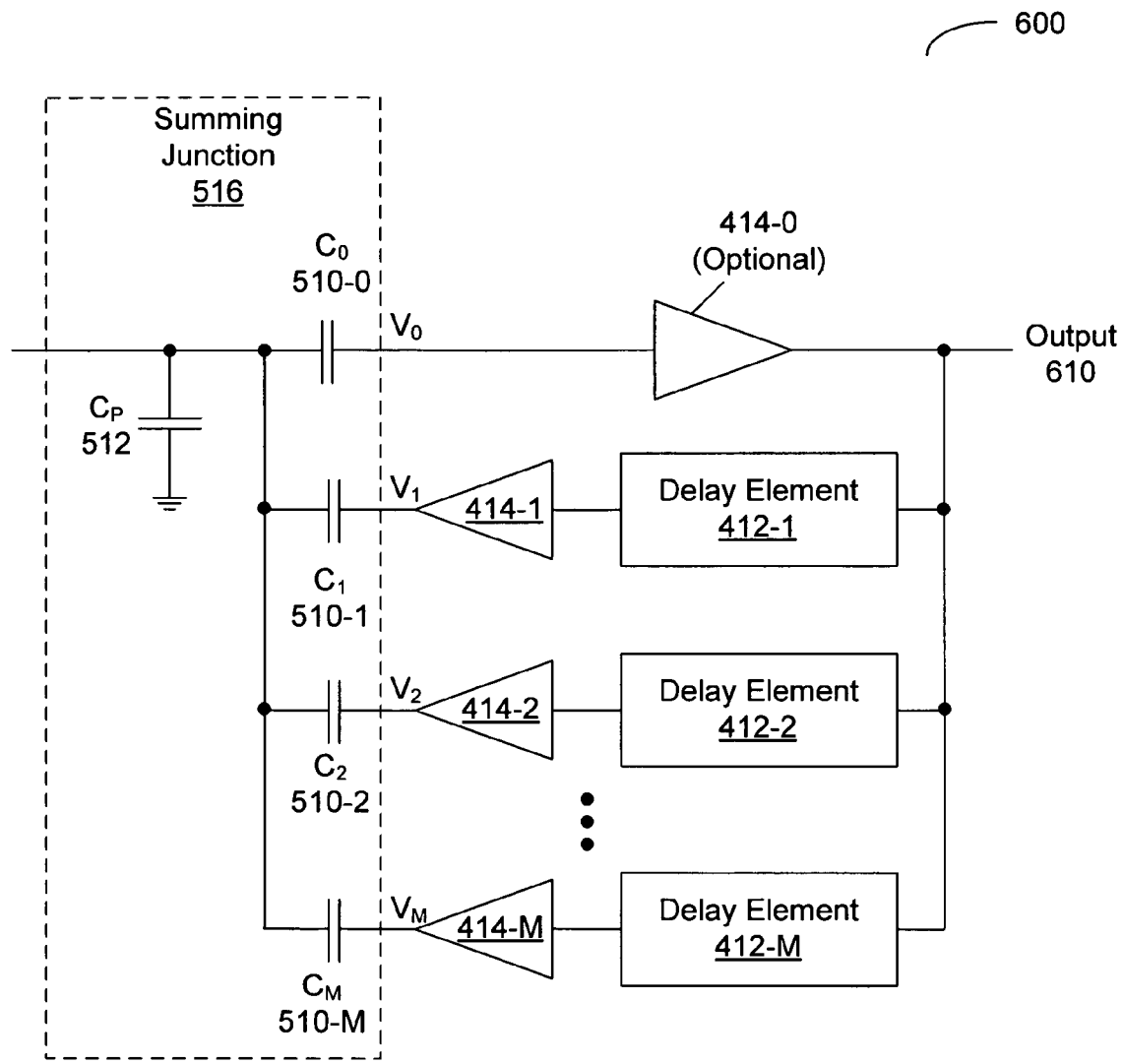
FIG. 6 is a block diagram illustrating an embodiment of a filter that includes a capacitive-summing junction.

FIG. 6 is a block diagram illustrating another embodiment of a filter 600 that includes the capacitive-summing junction 516. In this embodiment, filter 600 may be included within the equalizer 310-2 (FIG. 3B) in the receive circuit 114 (FIG. 3B). As with the filter 500 (FIG. 5), an output voltage 610 from the filter 600 may be expressed as in terms of the weighted average of the voltages $V_i$, with the relative weights set by the capacitances $C_i$ relative to the total capacitance. Filter 600 may include fewer components or additional components, two or more components may be combined into a single component, and/or a position of one or more components may be changed.

While the preceding discussion has focused on equalization, in other embodiments one or more filters, such as the filter 500 (FIG. 5), may be used to reduce cross-talk between two or more signal lines 120 (FIG. 1). For example, when a signal line (such as signal line 120-1) is transmitting a signal, parasitic capacitance between neighboring signal lines 120 may give rise to interference signals on neighboring signal lines 120. These interference signals may be reduced and/or eliminated by applying an appropriate signal to the affected signal lines 120 to cancel the effect of the crosstalk.

Attention is now directed towards methods for communicating signals. FIG. 7 is a flow chart illustrating an embodiment of a process 700 for communicating signals. During this process, signals may be communicated from a transmit circuit through a capacitive link to a receive circuit (710) using voltage-mode signaling. While communicating the signals, the signals may be equalized using a filter that includes a capacitive-summing junction (712). In some embodiments, there may be additional or fewer operations, and/or the order of the operations may be changed. Furthermore, two or more operations may be combined into a single operation.

Figure 8:
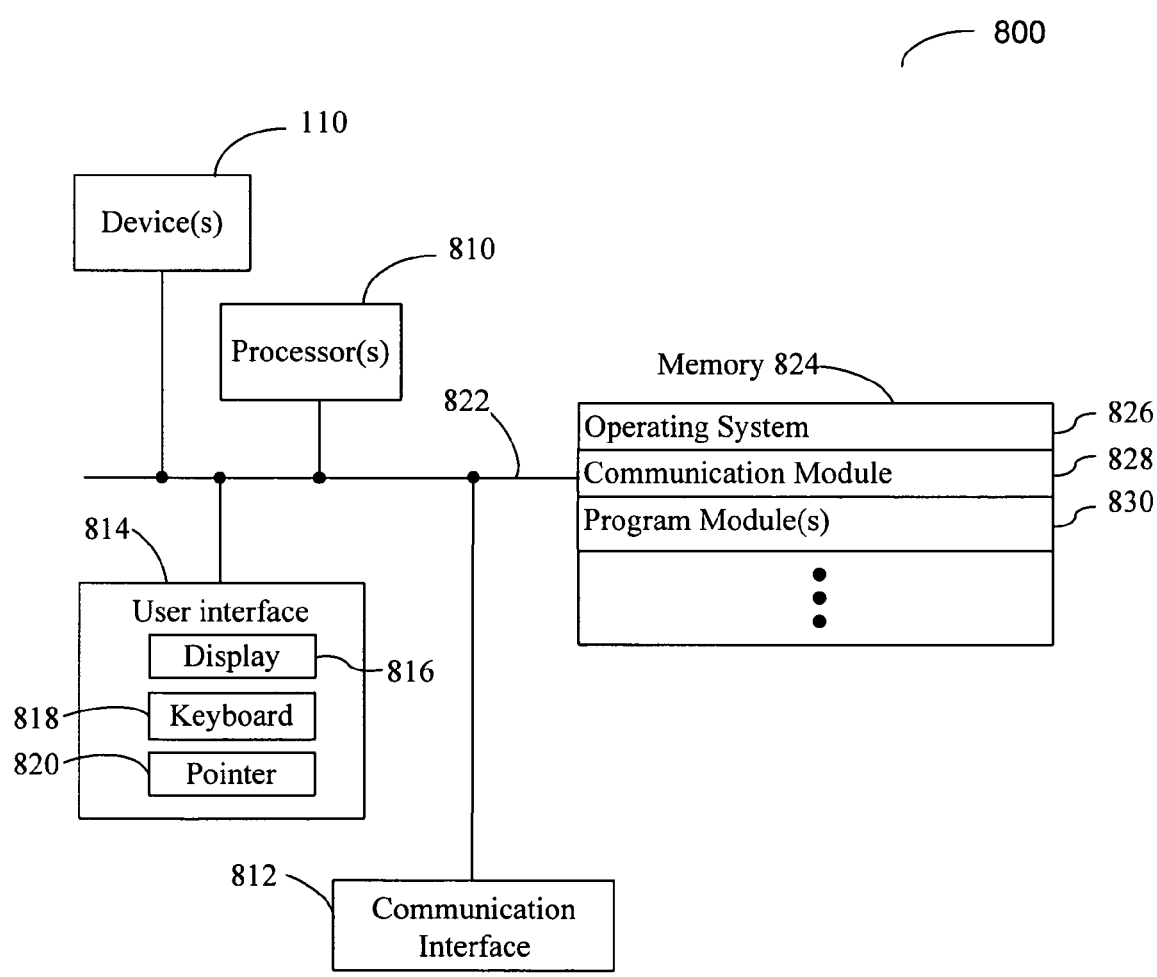
FIG. 8 is a block diagram illustrating an embodiment of a computer system.

Attention is now directed towards embodiments containing one or more circuits that include equalization in capacitively coupled communication links. FIG. 8 is a block diagram illustrating an embodiment of a computer system 800. Computer system 800 may include one or processors 810, a communication interface 812, a user interface 814, and one or more signal lines 822 coupling these components together. Note that one or more processing units 810 may support parallel processing and/or multi-threaded operation, the communication interface 812 may have a persistent communication connection, the one or more signal lines 822 may constitute a communication bus, and the user interface 814 may include a display 816, a keyboard 818, and/or a pointer, such as a mouse 820.

The computer system 800 may include memory 824, which may include high speed random access memory and/or non-volatile memory. More specifically, memory 824 may include ROM, RAM, EPROM, EEPROM, FLASH, one or more smart cards, one or more magnetic disc storage devices, and/or one or more optical storage devices. Memory 824 may store an operating system 826, such as LINUX, UNIX, OS X, or WINDOWS, that includes procedures (or a set of instructions) for handling various basic system services for performing hardware dependent tasks. The memory 824 may also store procedures (or a set of instructions) in a communication module 828. The communication procedures may be used for communicating with one or more computers and/or servers, including computers and/or servers that are remotely located with respect to the computer system 800.

Memory 824 may also include the one or more program modules (of sets of instructions) 830. Instructions in the program modules 830 in the memory 824 may be implemented in a high-level procedural language, an object-oriented programming language, and/or in an assembly or machine language. The programming language may be complied or interpreted, i.e, configurable or configured to be executed by the one or more processing units 810.

The computer system 800 may include one or more devices 110, such as one or more integrated circuits, that include the previously described embodiments that have equalization and capactively coupled links to improve communication channel performance. While not shown in the computer system 800, in some embodiments, such circuits may be included in the one or processors 810.

The computer system 800 may include fewer components or additional components, two or more components may be combined into a single component, and/or a position of one or more components may be changed. In some embodiments, implementation of functionality of the computer system 800 may be implemented more in hardware and less in software, or less in hardware and more in software, as is known in the art.

Although the computer system 800 is illustrated as having a number of discrete items, FIG. 8 is intended to be a functional description of the various features which may be present in the computer system 800 rather than as a structural schematic of the embodiments described herein. In practice, and as recognized by those of ordinary skill in the art, the functions of the computer system 800 may be distributed over a large number of servers or computers, with various groups of the servers or computers performing particular subsets of the functions. In some embodiments, some or all of the functionality of the computer system 800 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated circuit containing a communication channel, wherein the communication channel comprises:
    a transmit circuit configured to transmit signals using a voltage-mode driver;
    a capacitive link coupled to the transmit circuit;
    a receive circuit, wherein the transmit circuit is capacitively coupled to the receive circuit via the capacitive link;
    a filter to equalize signals communicated between the transmit circuit and the receive circuit, wherein the filter includes a capacitive-summing junction; and
    one or more taps in the filter, wherein an output voltage of the filter is a weighted average of voltages for taps in the filter, and wherein a weight for each voltage is proportional to a capacitance for the corresponding tap relative to a capacitance for the capacitive link, wherein the filter includes at least one tap with a weight element that has an adjustable weight, wherein adjusting the adjustable weight of the weight element involves adjusting a capacitance of the weight element, wherein a relationship between a control voltage input to the weight element and the capacitance of the weight element is non-linear.

2. The integrated circuit of claim 1, wherein the filter is included in the transmit circuit.

3. The integrated circuit of claim 1, wherein the filter is included in the receive circuit.

4. The integrated circuit of claim 1, wherein the filter is configured to reduce cross-talk between at least two signal lines in the link.

5. The integrated circuit of claim 1, wherein a frequency response for the link and the filter is approximately uniform over a range of frequencies.

6. The integrated circuit of claim 1, wherein the filter includes a finite impulse response (FIR) filter.

7. The integrated circuit of claim 1, wherein the capacitive-summing junction includes at least two signal lines that are proximate to one another.

8. The integrated circuit of claim 1, further including control logic, wherein the control logic is configured to adjust a frequency response of the filter in accordance with a performance metric of the communication channel.

9. The integrated circuit of claim 8, wherein the control logic is configured to adjust the frequency response when the integrated circuit is powered on.

10. The integrated circuit of claim 8, wherein the control logic is configured to adjust the frequency response after at least a pre-determined time interval since a last adjustment.

11. The integrated circuit of claim 8, wherein the control logic is configured to adjust the frequency response continuously.

12. The integrated circuit of claim 8, wherein the performance metric includes a difference between a sequence received by the receive circuit and a pre-determined sequence.

13. The integrated circuit of claim 1, wherein the filter includes delay elements that have discrete time delays.

14. The integrated circuit of claim 13, wherein the delay elements are configured to be clocked using a clock signal that has a frequency that is different from a chip rate of the integrated circuit.

15. The integrated circuit of claim 1, wherein the filter includes delay elements that have continuous time delays.

16. The integrated circuit of claim 1, wherein a capacitance of a respective weight element corresponds to a number of capacitances that are selectively coupled to an input and an output of the respective weight element.

17. A computer system, comprising:
    a processor;
    memory, wherein the memory is configured to store one or more program module mechanisms; and an integrated circuit containing a communication channel, wherein the communication channel includes:
- a transmit circuit configured to transmit signals using a voltage-mode driver;
- a capacitive link coupled to the transmit circuit;
- a receive circuit, wherein the transmit circuit is capacitively coupled to the receive circuit via the capacitive link;
- a filter to equalize signals communicated between the transmit circuit and the receive circuit, wherein the filter includes a capacitive-summing junction; and
- one or more taps in the filter, wherein an output voltage of the filter is a weighted average of voltages for taps in the filter, and wherein a weight for each voltage is proportional to a capacitance for the corresponding tap relative to a capacitance for the capacitive link, wherein the filter includes at least one tap with a weight element that has an adjustable weight, wherein adjusting the adjustable weight of the weight element involves adjusting a capacitance of the weight element, wherein a relationship between a control voltage input to the weight element and the capacitance of the weight element is non-linear.

18. A method of communicating signals within an integrated circuit, comprising:
- communicating signals from a transmit circuit through a capacitive link to a receive circuit, wherein the signals are communicated using voltage-mode signaling;
- as the signals are communicated, equalizing the signals using a filter that includes a capacitive-summing junction and one or more taps, wherein an output voltage of the filter is a weighted average of voltages for taps in the filter, and wherein a weight for each voltage is proportional to a capacitance for the corresponding tap relative to a capacitance for the capacitive link, wherein the filter includes at least one tap with a weight element that has an adjustable weight, wherein adjusting the adjustable weight of the weight element involves adjusting a capacitance of the weight element, wherein a relationship between a control voltage input to the weight element and the capacitance of the weight element is non-linear.

19. The integrated circuit of claim 1, further comprising control logic configured to adjust the capacitance for one or more taps.

* * * * *